United States Patent [19]
Breidenbach et al.

[11] Patent Number: 5,562,774
[45] Date of Patent: Oct. 8, 1996

[54] COATED QUARTZ GLASS COMPONENT

[75] Inventors: Poul E. Breidenbach, Bruchkobel;
Dietmar Hellmann, Linsengericht;
Helmut Leber, Hanau, all of Germany

[73] Assignee: Heraeus Quarzglas GmbH, Hanau, Germany

[21] Appl. No.: 507,631

[22] Filed: Jul. 25, 1995

[30] Foreign Application Priority Data

Aug. 23, 1994 [DE] Germany ............ 44 29 825.0

[51] Int. Cl.⁶ ............ C03C 17/22; C23C 16/30
[52] U.S. Cl. ............ 118/715; 118/728; 118/500; 156/345; 29/25.01; 211/41; 206/454
[58] Field of Search ............ 118/715, 728, 118/500; 156/345; 211/41; 29/25.01; 206/454

[56] References Cited

FOREIGN PATENT DOCUMENTS 3441956 of 1986 Germany.
62-116728 of 1987 Japan.

Primary Examiner—Richard Bueker
Attorney, Agent, or Firm—Felfe & Lynch

[57] ABSTRACT

Quartz glass component having a coating with a silicon carbide surface includes a gradient layer of silicon carbide and at least one additional constituent which is less hard and has a lower modulus of elasticity than silicon carbide and whose concentration decreases across the thickness of the layer from inside to outside. The coated component has good thermal-shock resistance and long-term stability in terms of its chemical resistance to hydrofluoric acid and nitric acid as well as to a mixture of these two acids.

9 Claims, 1 Drawing Sheet

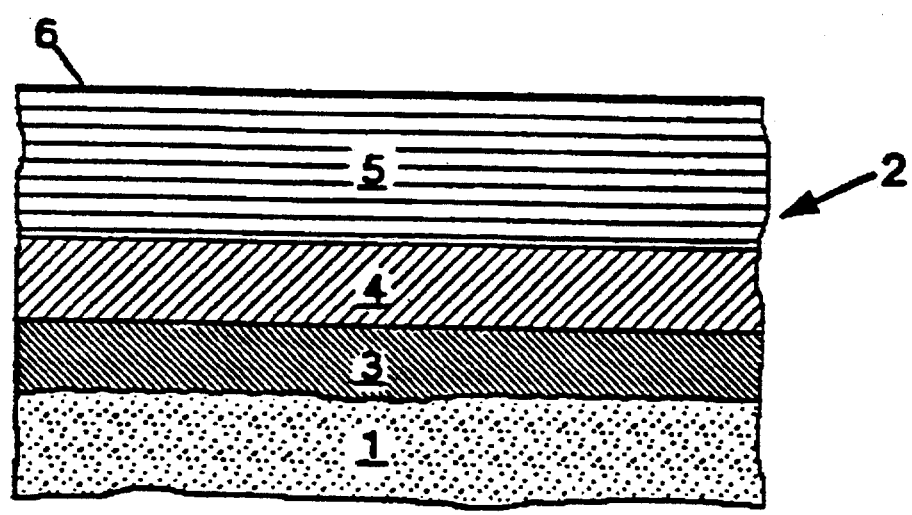

COATED QUARTZ GLASS COMPONENT

BACKGROUND OF THE INVENTION

The invention concerns a component for processes in semiconductor technology, made of quartz glass, having a coating whose surface consists of silicon carbide.

In the production of semiconductor components, substrate surfaces are frequently coated with silicon oxide, silicon nitride, or silicon. The known CVD (chemical vapor deposition) methods are used for this purpose. In the process, the coating materials are deposited on all the walls in the reaction space, including those of the furnace, the containers for the substrate, or the surfaces of other components. When these layers reach a certain thickness, they flake away from quartz glass surfaces, and can thereby lead to particle problems. To prevent this, the components in question must be cleaned repeatedly. To remove silicon layers, a caustic solution comprising a mixture of HF and $HNO_3$ is normally used. However, this caustic solution also attacks the quartz glass itself. It is known that a barrier to this caustic solution can be created by coating the surface of the component with SiC.

Known from Japanese Patent Application JP 62-116728 (1987) is a discharge nozzle made of quartz glass, which serves as the gas lead-in in a reaction furnace in an epitaxy process. The known nozzle has a surface layer of silicon carbide. Between the surface of the quartz glass and the silicon carbide layer, an intermediate layer is provided, which consists of silicon or of silicon nitride.

Because of the great differences between the coefficients of expansion of quartz glass and silicon carbide or silicon, the known layers have little resistance to thermal shock. This is caused on the one hand by the relatively firm adhesion of such layers to quartz glass, and on the other hand by the differences between the coefficients of expansion of the layer material and of the quartz glass, and the resulting stresses on the coating when the temperature changes. This leads to flaking or to microcracks in the layers, which in turn reduce the resistance of the known components to the caustic solutions described above, especially to the mixture of HF and $HNO_3$, and also reduce the prevention of diffusion of toxic semiconductor substances out of the component.

SUMMARY OF THE INVENTION

The object of the invention is to provide, based on the known components, a coated component which has good thermal-shock resistance and long-term stability in terms of its chemical resistance to hydrofluoric acid and nitric acid as well as to a mixture of these two acids and in terms of the diffusion of toxic semiconductor substances.

This object is attained with a gradient layer of silicon carbide and at least one additional constituent which is less hard and has a lower modulus of elasticity than silicon carbide and whose concentration decreases across the thickness of the layer from inside to outside. As a result of the gradient layer according to the invention, the thermal-shock resistance of the coating is significantly improved. The term gradient layer describes a layer that contains at least two constituents, one of which is silicon carbide, with the concentrations of the constituents having a gradient across the thickness of the gradient layer. The concentration gradient can be continuous or also stepwise. The improvement in the thermal-shock resistance of the coating can be based in Dart on a suitable coefficient of thermal expansion of the additional constituent, which is preferably between that of the quartz glass and that of silicon carbide. The essential function of the additional constituent is its contribution to the reduction of the stresses between the component and the coating. This is achieved in that the additional constituent is less hard and has a lower modulus of elasticity (E modulus) than silicon carbide. The reason for the resulting decrease in stress may be that the additional constituent, because it is less hard and has a lower modulus of elasticity, easily yields to mechanical stress and thus acts as a mechanical buffer between the quartz glass and the surface containing silicon carbide. In the literature, quartz glass is described as having a hardness of 7 (on the Mohs scale) and of 820 (on the Knoop scale), and silicon carbide has a hardness of at least 9.2 (Mohs) and of about 2,480 (Knoop). The E modulus of quartz glass is about 75 $GN/m^2$, and that of silicon carbide is in the range from 240 $GN/m^2$ to 400 $GN/m^2$. The concentration gradient within the gradient layer also contributes to the reduction in stress. It is assumed that the concentration gradient from outside to inside causes a displacement of the maximum stress, away from the stress-sensitive interface between quartz glass and coating and into the coating itself. Because of the improved thermal-shock resistance of the coating, the danger of the formation of cracks in the coating is reduced, and therefore the long-term stability of the components with respect to their chemical stability and their prevention of the diffusion of toxic semiconductor substances is improved.

Particularly advantageous are components in which the additional constituent contains silicon, especially silicon, silicon nitride, and/or silicon oxide. The silicon content facilitates a chemical solubility of the silicon carbide in the additional constituent. In comparison to a dispersion of SiC particles in the constituent, this causes a more homogeneous distribution of stress across the thickness of the gradient layer and therefore an improved thermal-shock resistance of the coated component. In particular, metallic silicon is distinguished by very low hardness in comparison to silicon carbide. The hardness of silicon is even less than the values cited for quartz glass. In the literature, values of about 100 $GN/m^2$ are reported for the E modulus of monocrystalline silicon, and values between 140 $GN/m^2$ and 210 $GN/m^2$ for that of silicon nitride. The decrease in stress achieved by the constituent containing silicon carbide is further enhanced because the coefficient of thermal expansion of the additional component in the range near room temperature lies between that of quartz glass ($\alpha=0.5\times10^{-6}$ per degree) and that of silicon carbide ($\alpha=4.3\times10^{-6}$ per degree to $5.8\times10^{-6}$ per degree). Thus, silicon has a corresponding coefficient of thermal expansion $\alpha$ of about $3\times10^{-6}$ per degree, and silicon nitride has a coefficient of thermal expansion $\alpha_{20/1000}$ in the range from $2.9\times10^{-6}$ per degree to $3.5\times10^{-6}$ per degree.

A coated component in which the surface of the coating is formed by the gradient layer is preferred. This embodiment of the component is especially simple to produce and ensures good chemical resistance to attack by acids. A more favorable distribution of the mechanical stresses across the thickness of the gradient layer is achieved with a coating in which the content of silicon carbide in the gradient layer continuously increases across the thickness of the layer from inside to outside. A continuous increase in the SiC concentration improves the thermal-shock resistance.

Especially advantageous is a component having a gradient layer which contains silicon and silicon carbide in such a way that the concentration of metallic silicon in the region of the surface of the coating in the gradient layer is equal to zero. The surface is formed exclusively by silicon carbide. Such a component is distinguished by good chemical resistance to attack by acids, and especially by an acid mixture of hydrofluoric acid and nitric acid such as is normally used for the caustic removal of silicon. This acid resistance is achieved by an impermeable silicon carbide surface of the component. Metallic silicon has a very low hardness in comparison to SiC. Its concentration in the gradient layer increases from the inside, where it may be, for example, 100%, to the outside. The high silicon concentration in the gradient layer in the region of the gradient layer facing the quartz glass of the component causes a reduction in the mechanical stresses that would otherwise arise between the SiC-containing surface and the quartz glass. As a result, a very good thermal-shock resistance of the coating is achieved. The zero concentration of metallic silicon in the region of the surface in turn ensures the required chemical resistance.

It has been found advantageous to use a component having a gradient layer with a thickness in the range between 5 μm and 100 μm. With thinner layers, the reduction in stress achieved by the gradient layer is not adequate; thicker layers tend to flake off.

It has been found advantageous to underlay the gradient layer with an intermediate layer of silicon. Because the gradient layer undergoes the transition to a layer of silicon in the region facing the quartz glass of the component, the stresses caused by the different coefficients of thermal expansion of quartz glass and silicon carbide are particularly effectively reduced, or are displaced into a region within the coating that is farther from the sensitive quartz glass surface. It has been found advantageous for the thickness of the silicon layer to be in the range between 5 μm and 100 μm.

Preferred is an embodiment of the coated component in which the surface of the component is chemically roughened. The roughening leads to better adherence of the coating to the quartz glass. In contrast to a mechanical roughening, for example by sandblasting, chemical toughening does not cause any damage to the quartz glass surface. However, the roughening achieves its essential function in combination with the gradient layer. That is, it has been found that the roughened surface contributes significantly to the reduction of stress in the gradient layer. The reason for this effect may be that the roughening prevents the development of a uniform, plain stress front in the region of the interface between the component and its coating. It has been found especially effective to roughen the quartz glass with a mean surface roughness in the range of 0.5 μm to 10 μm.

BRIEF DESCRIPTION OF THE DRAWING

The sole FIGURE shows a cross-section through a component according to the invention, with an applied coating.

DETAILED DESCRIPTION OF THE PREFERRED EMBODIMENT

The component 1 may be a quartz glass boat for holding silicon wafers. The surface of the component 1 is chemically roughened with a mean surface roughness of about 1 μm. The coating 2 comprises three layers 3, 4, 5. The layer immediately adjacent to the component 1 is an intermediate layer 3, about 10 μm thick, of polycrystalline silicon. The intermediate layer 3 is followed by a gradient layer 4. The gradient layer 4, which consists of silicon and silicon carbide, has a thickness of about 15 μm. In the gradient layer 4, the concentration of silicon carbide increases continuously from the region adjacent to the intermediate layer 3 outward. The concentration of metallic silicon correspondingly decreases across the thickness of the gradient layer 4. A surface layer 5 of silicon carbide is applied to the gradient layer 4. The surface layer 5 has a thickness of about 35 μm. The surface of the surface layer 5, which simultaneously forms the surface 6 of the coating 2, consists of pure silicon carbide. The total thickness of the coating 2 is about 60 μm. The coating 2 is applied in a single process in a standard CVD furnace. For coating with amorphous silicon, SiHa is directed into the furnace at a temperature of about 600° C. and deposited on the surface of the component. To produce the gradient layer 4, a carbon-containing gas, for example $CH_4$, is increasingly admixed to the processing gas along with hydrogen. At the same time, the temperature within the furnace is also increased. To produce the surface layer 5, the furnace temperature is about 850° C. The ratio of silicon from the SiHa and carbon from the CHa corresponds to the stoichiometric ratio of 1:1.

Because of the differences between the coefficients of thermal expansion of pure quartz glass and silicon and especially of silicon carbide, stresses arise in the coating 2 upon cooling from the processing temperature. These may cause flaking of the layers 3, 4, 5. Roughening the surface of the component 1 not only improves the adherence of the coating 2, but also contributes to the reduction of the stresses in the coating 2. The intermediate layer 3 adheres very well to the quartz glass surface of the component 1. The concentration gradient in the gradient layer 4 is significant for the reduction of stresses in the coating 2. The stress reduction is based on the fact that the additional constituent of the gradient layer 4 in addition to the silicon carbide, in this case silicon, has a significantly lower hardness and a significantly smaller E modulus than the silicon carbide itself. Because of its coefficient of thermal expansion of about $3 \times 10^{-6}$ per degree, which is between that of quartz glass and that of silicon carbide, the silicon in the gradient layer 4 further contributes to the reduction of the stresses between the surface of the component 1 and the surface layer 5. The surface layer 5 of pure silicon carbide ensures both a high impermeability of the coating to the diffusion of impurities out of the component 1 and a high chemical resistance to attack by acids, especially by hydrofluoric acid and nitric acid and by a mixture of these two acids.

Thus, coating 2 in its entirety has a good thermal-shock resistance and a high long-term stability in terms of its chemical resistance and the diffusion of toxic semiconductor substances.

We claim:

1. Component for processes in semiconductor technology made of quartz glass, having a coating whose surface consists of silicon carbide, wherein the coating comprises a gradient layer of silicon carbide and at least one additional constituent which is less hard and has a lower modulus of elasticity than silicon carbide and whose concentration decreases across the thickness of the layer from inside to outside.

2. Component in claim 1, wherein said additional constituent consists of at least of silicon, silicon nitride, and silicon oxide.

3. Component in claim 1 wherein the surface of the coating is formed by the gradient layer.

4. Component as in claim 1 wherein the silicon carbide in the gradient layer has a concentration which increases continuously across the thickness of the layer from inside to outside.

5. Component in claim 1 wherein the gradient layer contains silicon and silicon carbide, said gradient layer having a portion closest to said surface wherein the concentration of metallic silicon is equal to zero.

6. Component in claim 1 wherein the thickness of the gradient layer is in the range between 5 μm and 100 μm.

7. Component in claim 1 further comprising an intermediate layer of silicon between said component and said gradient layer.

8. Component as in claim 1 wherein said component has a surface which is chemically roughened.

9. Component as in claim 8 wherein the surface of the component is roughened with a mean surface of ca. 1 μm.

* * * * *